(12) United States Patent
Horikawa et al.

(10) Patent No.: US 10,998,526 B2
(45) Date of Patent: May 4, 2021

(54) ORGANIC EL DISPLAY PANEL INCLUDING A MULTILAYER SEALING LAYER, ORGANIC EL DISPLAY DEVICE, AND MANUFACTURING METHOD THEREOF

(71) Applicant: JOLED INC., Tokyo (JP)

(72) Inventors: Keiji Horikawa, Tokyo (JP); Kenji Harada, Tokyo (JP); Akifumi Okigawa, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/122,880

(22) Filed: Sep. 6, 2018

(65) Prior Publication Data
US 2019/0081280 A1    Mar. 14, 2019

(30) Foreign Application Priority Data
Sep. 8, 2017    (JP) .............................. JP2017-173540

(51) Int. Cl.
*H01L 51/52* (2006.01)
*H01L 51/56* (2006.01)
(Continued)

(52) U.S. Cl.
CPC ........ *H01L 51/5259* (2013.01); *H01L 51/524* (2013.01); *H01L 51/5256* (2013.01); *H01L 51/56* (2013.01); *H01L 27/3244* (2013.01); *H01L 27/3246* (2013.01); *H01L 51/0005* (2013.01); *H01L 51/0023* (2013.01); *H01L 51/5012* (2013.01); *H01L 51/5072* (2013.01);
(Continued)

(58) Field of Classification Search
CPC ........................ H01L 51/5259; H01L 51/5256
See application file for complete search history.

(56) References Cited

U.S. PATENT DOCUMENTS

2003/0164677 A1    9/2003    Miyaguchi et al.
2009/0309486 A1*  12/2009    Imai .................... H01L 51/5256
                                                                313/504
(Continued)

FOREIGN PATENT DOCUMENTS

CN    101326858 A    12/2008
CN    107275507 A    10/2017
(Continued)

*Primary Examiner* — Khiem D Nguyen
*Assistant Examiner* — Laura M Dykes
(74) *Attorney, Agent, or Firm* — Hauptman Ham, LLP

(57) ABSTRACT

An organic electroluminescence (EL) display panel includes a substrate; a plurality of organic EL elements; and a sealing layer in this order. In the organic EL display panel, the sealing layer has a three-layered structure in the order of a first sealing layer, a second sealing layer, and a third sealing layer. In the organic EL display panel, the first sealing layer, the second sealing layer, and the third sealing layer each include amorphous silicon nitride. In the organic EL display panel, when composition of the first sealing layer, composition of the second sealing layer, and composition of the third sealing layer are each indicated as $SiN_x$, a value of x in the composition of the second sealing layer is greater than both a value of x in the composition of the first sealing layer and a value of x in the composition of the third sealing layer.

20 Claims, 8 Drawing Sheets

(51) Int. Cl.
 *H01L 51/50* (2006.01)
 *H01L 51/00* (2006.01)
 *H01L 27/32* (2006.01)

(52) U.S. Cl.
 CPC ...... *H01L 51/5218* (2013.01); *H01L 51/5234* (2013.01); *H01L 2227/323* (2013.01); *H01L 2251/301* (2013.01)

(56) References Cited

U.S. PATENT DOCUMENTS

| | | | | |
|---|---|---|---|---|
| 2010/0243999 | A1* | 9/2010 | Ishikawa | C23C 16/345 257/40 |
| 2012/0228641 | A1* | 9/2012 | Thoumazet | C23C 16/0245 257/79 |
| 2012/0228668 | A1 | 9/2012 | Thoumazet et al. | |
| 2013/0221358 | A1 | 8/2013 | Morosawa et al. | |
| 2016/0111684 | A1* | 4/2016 | Savas | H01L 51/5256 257/40 |
| 2017/0288173 | A1 | 10/2017 | Horikawa | |
| 2018/0083225 | A1 | 3/2018 | Nishikawa et al. | |

FOREIGN PATENT DOCUMENTS

| | | | |
|---|---|---|---|
| JP | 2000-223264 | A | 8/2000 |
| JP | 2004-292877 | A | 10/2004 |
| JP | 2007184251 | A | 7/2007 |
| JP | 2010244697 | A | 10/2010 |
| JP | 2013504776 | A | 2/2013 |
| JP | 2013504863 | A | 2/2013 |
| JP | 2013145668 | A | 7/2013 |
| JP | 2013179141 | A | 9/2013 |
| WO | 2009028485 | A1 | 3/2009 |
| WO | 2011029786 | A | 3/2011 |
| WO | 2011029787 | A1 | 3/2011 |
| WO | 2016147639 | A1 | 9/2016 |

* cited by examiner

Film-forming condition used by CVD device

|  | Silicon nitride films 108a, 108c | Silicon nitride film 108b |
|---|---|---|
| Pressure | 100 Pa | 200 Pa–500 Pa |
| $SiH_4$ flow rate | 100 sccm | |
| $NH_3$ flow rate | 70 sccm | |
| $N_2$ gas flow rate | 3000 sccm | |
| $SiH_4/NH_3$ ratio | 1.4 | 0.2–0.65 |

ORGANIC EL DISPLAY PANEL INCLUDING A MULTILAYER SEALING LAYER, ORGANIC EL DISPLAY DEVICE, AND MANUFACTURING METHOD THEREOF

This application claims priority to Japanese Patent Application No. 2017-173540 filed Sep. 8, 2017, the contents of which are hereby incorporated by reference in its entirety.

BACKGROUND

Technical Field

The present disclosure relates to an organic electroluminescence (EL) display panel, a display device that uses the organic EL display panel, and a method of manufacturing the organic EL display panel, and in particular to improvement of durability of a sealing layer.

Description of Related Art

Organic EL display panels include a sealing layer for protecting the entirety of a plurality of organic EL elements that are arranged two-dimensionally from deterioration caused by moisture, gas, or the like. Conventionally, the sealing layer is formed by using silicon nitride (SiN) or the like in plasma-enhanced chemical vapor deposition (PECVD). If forming of a silicon nitride film is performed such that the silicon nitride film has a high film density and the silicon nitride film has a high sealing property, the sealing layer has a very small tolerance for bending, and therefore has a low sealing property when unevenness exists and/or an impurity is present in a portion covered by the sealing layer. In view of this, for example, the sealing layer of JP2000-223264 has a three-layered structure of a silicon nitride film, an organic film, and a silicon nitride film and compensates for unevenness with use of the organic film in order to help to prevent deterioration of the sealing property of the silicon nitride film on the organic film and to achieve improvement of the sealing property of the sealing layer.

SUMMARY

The present disclosure includes an organic EL display panel including a silicon nitride film having a high sealing property and therefore providing the organic EL elements with an improved protection.

An organic EL display panel pertaining to at least one aspect of the present disclosure includes: a substrate; a plurality of organic EL elements; and a sealing layer in this order. In the organic EL display panel, the sealing layer has a three-layered structure in the order of a first sealing layer, a second sealing layer, and a third sealing layer. In the organic EL display panel, the first sealing layer, the second sealing layer, and the third sealing layer each include amorphous silicon nitride. In the organic EL display panel, when composition of the first sealing layer, composition of the second sealing layer, and composition of the third sealing layer are each indicated as $SiN_x$, a value of x in the composition of the second sealing layer is greater than both a value of x in the composition of the first sealing layer and a value of x in the composition of the third sealing layer.

In this structure, the second sealing layer has a moisture absorbing property, and therefore this structure helps to prevent sealing property deterioration even when a crack appears in the sealing layer.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

DETAILED DESCRIPTION

<Aspects of Disclosure>

Figure 1:
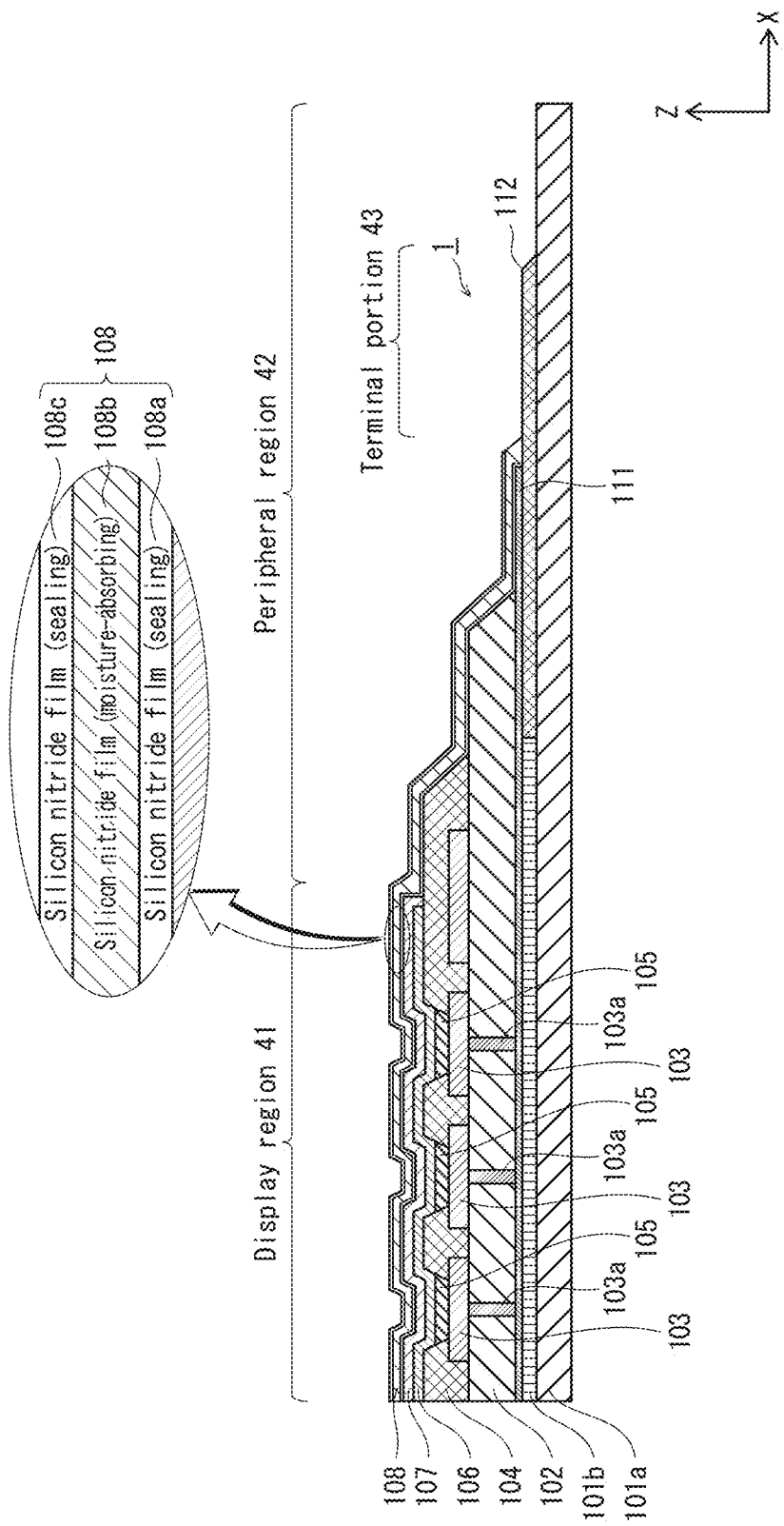
FIG. 1 is a schematic cross-sectional view of a structure of an organic EL display panel 1 pertaining to at least one embodiment.

An organic EL display panel pertaining to at least one aspect of the present disclosure includes: a substrate; a plurality of organic EL elements; and a sealing layer in this order. In the organic EL display panel, the sealing layer has a three-layered structure in the order of a first sealing layer, a second sealing layer, and a third sealing layer. In the organic EL display panel, the first sealing layer, the second sealing layer, and the third sealing layer each include amorphous silicon nitride. In the organic EL display panel, when composition of the first sealing layer, composition of the second sealing layer, and composition of the third sealing layer are each indicated as $SiN_x$, a value of x in the composition of the second sealing layer is greater than both a value of x in the composition of the first sealing layer and a value of x in the composition of the third sealing layer.

In this structure, the second sealing layer has a moisture absorbing property, and therefore this structure helps to prevent sealing property deterioration even when a crack appears in the sealing layer.

According to an organic EL display panel pertaining to at least one aspect of the present disclosure, the second sealing layer has a smaller refractive index than the first sealing layer and the third sealing layer.

In this structure, the second sealing layer has a moisture absorbing property and the first sealing layer and the third sealing layer have high sealing properties.

According to an organic EL display panel pertaining to at least one aspect of the present disclosure, the refractive index of the second sealing layer is from 1.60 to 1.78.

In this structure, the second sealing layer has a high moisture absorbing property.

According to an organic EL display panel pertaining to at least one aspect of the present disclosure, the first sealing layer and the third sealing layer have substantially the same refractive indices.

In this structure, both the first sealing layer and the third sealing layer have high sealing properties.

According to an organic EL display panel pertaining to at least one aspect of the present disclosure, when the first sealing layer, the second sealing layer, and the third sealing layer are in an atmosphere of the same temperature and the same humidity, a material of the second sealing layer has greater reactivity in a reaction of absorbing oxygen from moisture in the atmosphere than both a material of the first sealing layer and a material of the third sealing layer.

According to an organic EL display panel pertaining to at least one aspect of the present disclosure, the third sealing layer has a flaw. In the organic EL display panel, a portion of the second sealing layer corresponding to the flaw of the third sealing layer is exposed to air. In the organic EL display panel, a ratio of a number of oxygen atoms to a number of silicon atoms is greater in the second sealing layer than in the first sealing layer and in the third sealing layer.

In this structure, the second sealing layer has a high shielding property against moisture.

An organic EL display panel pertaining to at least one aspect of the present disclosure includes: a substrate; a plurality of organic EL elements; and a sealing layer in this order. In the organic EL display panel, the sealing layer has a three-layered structure in the order of a first sealing layer, a second sealing layer, and a third sealing layer. In the organic EL display panel, the first sealing layer, the second sealing layer, and the third sealing layer each include amorphous silicon nitride. In the organic EL display panel, when the first sealing layer, the second sealing layer, and the third sealing layer are in an atmosphere of the same temperature and the same humidity, a material of the second sealing layer has greater reactivity in a reaction of absorbing oxygen from moisture in the atmosphere than both a material of the first sealing layer and a material of the third sealing layer.

In this structure, the second sealing layer has a moisture absorbing property, and therefore this structure helps to prevent deterioration of a sealing property against moisture even when a crack appears in the sealing layer.

An organic EL display device pertaining to at least one aspect of the present disclosure includes an organic EL display panel, including: a substrate; a plurality of organic EL elements; and a sealing layer in this order. In the organic EL display device, the sealing layer has a three-layered structure in the order of a first sealing layer, a second sealing layer, and a third sealing layer. In the organic EL display device, the first sealing layer, the second sealing layer, and the third sealing layer each include amorphous silicon nitride. In the organic EL display device, when composition of the first sealing layer, composition of the second sealing layer, and composition of the third sealing layer are each indicated as $SiN_x$, a value of x in the composition of the second sealing layer is greater than both a value of x in the composition of the first sealing layer and a value of x in the composition of the third sealing layer.

This helps to achieve an organic EL display panel providing the organic EL elements with an improved protection.

A method of manufacturing an organic EL display panel pertaining to at least one aspect of the present disclosure includes: forming a substrate, a plurality of organic EL elements, and a sealing layer in this order. In the method, the forming of the sealing layer includes: forming a first sealing layer; forming a second sealing layer on the first sealing layer; and forming a third sealing layer on the second sealing layer. In the method, the forming of the first sealing layer, the forming of the second sealing layer, and the forming of the third sealing layer each include forming of an amorphous silicon nitride film through chemical vapor deposition. In the method, a ratio of a number of nitrogen atoms to a number of silicon atoms is greater in the second sealing layer than in the first sealing layer and in the third sealing layer.

This helps to achieve the second sealing layer that has a moisture absorbing property and the first sealing layer and the third sealing layer that have high sealing properties, and helps to achieve the sealing layer having a high sealing property.

According to a method of manufacturing an organic EL display panel pertaining to at least one aspect of the present disclosure, the forming of the amorphous silicon nitride film through chemical vapor deposition includes using gas including silane and ammonia. In the method, a ratio of a number of silane molecules to a number of ammonia molecules in the forming of the second sealing layer is smaller than both a ratio of a number of silane molecules to a number of ammonia molecules in the forming of the first sealing layer and a ratio of a number of silane molecules to a number of ammonia molecules in the forming of the third sealing layer.

According to a method of manufacturing an organic EL display panel pertaining to at least one aspect of the present disclosure, the ratio of a number of silane molecules to a number of ammonia molecules in the forming of the second sealing layer is from 0.2 to 0.65.

According to a method of manufacturing an organic EL display panel pertaining to at least one aspect of the present disclosure, the forming of the amorphous silicon nitride film through chemical vapor deposition includes using gas including silane and ammonia. In the method, a pressure of the gas in the forming of the second sealing layer is higher than both a pressure of the gas in the forming of the first sealing layer and a pressure of the gas in the forming of the third sealing layer.

According to a method of manufacturing an organic EL display panel pertaining to at least one aspect of the present disclosure, the pressure of the gas in the forming of the second sealing layer is from 200 Pa to 500 Pa.

This helps to form dense silicon nitride layers for the first sealing layer and the third sealing layer, and helps to form the second sealing layer having a moisture absorbing property.

The following describes an organic EL display panel pertaining to at least one embodiment. Note that the following description is an exemplification for describing a structure, an operation, and an effect pertaining to at least one embodiment, and components that are not essential to the present disclosure are not limited to the embodiment described below.

Embodiment

1. Structure of Organic EL Display Panel

FIG. 1 is a partial cross-sectional view of an organic EL display panel 1 pertaining to at least one embodiment. The organic EL display panel 1 includes a plurality of pixels, and each of the pixels includes organic EL elements each emitting a different one of three colors red, green, and blue (R, G, and B). Each of the organic EL elements is a so-called top-emission type of element emitting light forward (upward in a Z direction in FIG. 1).

In FIG. 1, the organic EL display panel 1 includes a substrate 101, an interlayer insulating layer 102, pixel electrodes 103, a bank layer 104, light-emitting layers 105, an electron transport layer 106, a counter electrode 107, a sealing layer 108, a passivation film 111, and wiring layers 112. Among these layers, the substrate 101, the interlayer insulating layer 102, the electron transport layer 106, the counter electrode 107, the sealing layer 108, the passivation film 111, and the wiring layers 112 span over the pixels.

<Substrate>

The substrate 101 includes a base member 101a that is made of an electrically-insulating material and a thin film transistor (TFT) layer 101b. The TFT layer 101b includes drive circuits corresponding one-to-one with the pixels. The base member 101a may be, for example, a glass substrate; a silica glass substrate; a silicon substrate; a metal substrate of a metal such as molybdenum sulfide, copper, zinc, aluminum, stainless steel, magnesium, iron, nickel, gold, silver, or the like; a semiconductor substrate such as gallium arsenide; a plastic substrate, or similar. For a plastic material for the plastic substrate, a thermoplastic resin or a thermosetting resin may be used. For example, polyethylene; polypropylene; polyamide; polyimide (PI); polycarbonate; an acrylic resin; polyethylene terephthalate (PET); polybutylene terephthalate; polyacetal; other fluorine-based resins; thermoplastic elastomer such as styrenic elastomer, polyolefin elastomer, polyvinyl chloride elastomer, polyurethane elastomer, fluorine rubber elastomer, and chlorinated polyethylene elastomer; an epoxy resin; an unsaturated polyester; a silicone resin; polyurethane, or the like, or copolymer, blend, polymer alloy or the like mainly including such a material, primarily consisting of one of the above, or a layered body including layers of one or more of the above can be used.

When the base member 101a is composed of a plastic substrate such as a flexible substrate, it is beneficial that a sealing layer having the same structure as the sealing layer 108 described later is disposed between the base member 101a and the TFT layer 101b.

<Interlayer Insulating Layer>

The interlayer insulating layer 102 is disposed on the substrate 101. The interlayer insulating layer 102 is made of a resin material and planarizes unevenness of an upper surface of the passivation film 111 that is disposed on the TFT layer 101b. For the resin material, for example, a positive photosensitive material is used. Examples of such a photosensitive material are an acrylic resin, a polyimide resin, a siloxane resin, and a phenolic resin.

<Pixel Electrodes>

The pixel electrodes 103 each include a metal layer made of a light-reflective metal material and are disposed on the interlayer insulating layer 102. The pixel electrodes 103 correspond one-to-one with the pixels and are electrically connected to the TFT layer 101b through contact holes.

In the present embodiment, the pixel electrodes 103 function as anodes.

Specific examples of a metal material having light-reflectivity are silver (Ag); aluminum (Al); an aluminum alloy; molybdenum (Mo); a silver, palladium, and copper alloy (APC); a silver, rubidium, gold alloy (ARA); a molybdenum chromium alloy (MoCr); a molybdenum tungsten alloy (MoW); a nickel chromium alloy (NiCr), and the like.

The pixel electrodes 103 may each be a single metal layer or may each have a layered structure in which a layer made of a metal oxide such as indium tin oxide (ITO) or indium zinc oxide (IZO) is laminated on a metal layer.

<Bank Layer>

The bank layer 104 is disposed on the pixel electrodes 103 with portions of upper surfaces of the pixel electrodes 103 being exposed and regions around the exposed portions of the upper surfaces of the pixel electrodes 103 being covered by the bank layer 104. Regions in the upper surfaces of the pixel electrodes 103 that are not covered by the bank layer 104 (hereinafter referred to as "openings") correspond one-to-one with the subpixels. That is, the bank layer 104 has openings corresponding one-to-one with the subpixels.

The bank layer 104 is made of, for example, an electrically-insulating organic material (such as an acrylic resin, a polyimide resin, a novolac resin, a phenolic resin, or the like). When the light-emitting layers 105 are formed through an application process, the bank layer 104 functions as a structure for preventing the applied ink from flowing out. When the light-emitting layers 105 are formed through vapor deposition, the bank layer 104 functions as a structure for placing a vapor deposition mask. In the present embodiment, the bank layer 104 is made of a resin material. For a material of the bank layer 104, an acrylic resin, a polyimide resin, a siloxane resin, or a phenolic resin can be used. In the present embodiment, a phenolic resin is used.

<Light-Emitting Layers>

The light-emitting layers 105 are in the openings and each have a function of emitting light of one of the colors R, G, and B through recombination of holes and electrons. For a material of the light-emitting layers 105, a known material can be used. Specifically, for example, the light-emitting layers 105 are beneficially made of a fluorescent substance such as an oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, or rare earth metal complex.

<Electron Transport Layer>

The electron transport layer 106 has a function of transporting electrons from the counter electrode 107 to the light-emitting layers 105. The electron transport layer 106 is made of, for example, an organic material having a high electron transport property. Specifically, the electron transport layer 106 is made of a π electron system small-molecule organic material such as an oxadiazole derivative (OXD), a triazole derivative (TAZ), a phenanthroline derivative (BCP, Bphen), or the like. The electron transport layer 106 may be doped with a metal selected from alkali metals and alkaline earth metals. Alternatively, for example, the electron transport layer 106 may be made of a metal selected from alkali metals, alkaline earth metals, and fluorides of such metals.

<Counter Electrode>

The counter electrode 107 is made of a light-transmissive electrically-conductive material and is disposed on the electron transport layer 106. The counter electrode 107 functions as a cathode.

For a material of the counter electrode 107, for example, ITO or IZO can be used. Alternatively, for a material of the counter electrode 107, a thin film made by using a metal such as silver, a silver alloy, aluminum, an aluminum alloy, or the like may be used.

<Sealing Layer>

The sealing layer 108 has a function of preventing organic layers such as the light-emitting layers 105 and the electron transport layer 106 from being exposed to moisture, air, or the like, and is made of silicon nitride (SiN). Details of the sealing layer 108 are described later.

<Passivation Film>

The passivation film 111 is a protective film that covers the TFT layer 101b and the wiring layers 112 that extend from the TFT layer 101b, and is made of silicon nitride (SiN), silicon oxide (SiO), silicon oxynitride (SiON), or the like.

<Wiring Layers>

The wiring layers 112 are made of an electrically-conductive material, and are disposed at intervals outside a region in which the sealing layer 108 is disposed. Specifically, for example, the wiring layers 112 are made of a metal such as chromium (Cr), molybdenum (Mo), aluminum (Al), titanium (Ti), copper (Cu), or the like, an alloy (such as MoW, MoCr, NiCr), or the like.

2. Film Structure of Sealing Layer

The following describes the structure of the sealing layer 108 in detail.

The sealing layer 108 includes the following three layers: a first sealing layer 108a, a second sealing layer 108b, and a third sealing layer 108c. The first sealing layer 108a, the second sealing layer 108b, and the third sealing layer 108c are all made of amorphous silicon nitride and formed through chemical vapor deposition (CVD). For example, silane ($SiH_4$) and ammonia ($NH_3$) are used as gas for forming the first sealing layer 108a, the second sealing layer 108b, and the third sealing layer 108c (the gas is hereinafter referred to as the material gas). Nitrogen ($N_2$) may additionally be used.

The first sealing layer 108a covers an upper surface of the counter electrode 107. The first sealing layer 108a is formed through CVD under film-forming conditions of small gas amounts of silane and ammonia, which are materials for the first sealing layer 108a, and a low pressure. Accordingly, silicon-nitrogen (Si—N) groups and nitrogen-hydrogen (N—H) groups in the composition have a uniform structure. Thus, the first sealing layer 108a has a uniform film structure without structural defects and has a high sealing property.

The second sealing layer 108b covers an upper surface of the first sealing layer 108a. Film-forming conditions for the second sealing layer 108b differ from film-forming conditions for the first sealing layer 108a in: (i) a large gas amount of ammonia relative to the gas amount of silane; and (ii) a high pressure. Due to this, the second sealing layer 108b has a larger number of N atoms relative to a number of Si atoms compared to the first sealing layer 108a. That is, $p<q$ is satisfied where composition of silicon nitride in the first sealing layer 108a is $SiN_p$ and composition of silicon nitride in the second sealing layer 108b is $SiN_q$. The second sealing layer 108b has a nonuniform film structure and has a low sealing property.

The third sealing layer 108c covers an upper surface of the second sealing layer 108b, and film-forming conditions for the third sealing layer 108c are the same as the film-forming conditions for the first sealing layer 108a. Thus, the third sealing layer 108c has a uniform film structure without structural defects and has a high sealing property.

<Moisture Absorbing Property of Second Sealing Layer>

Figure 3A:
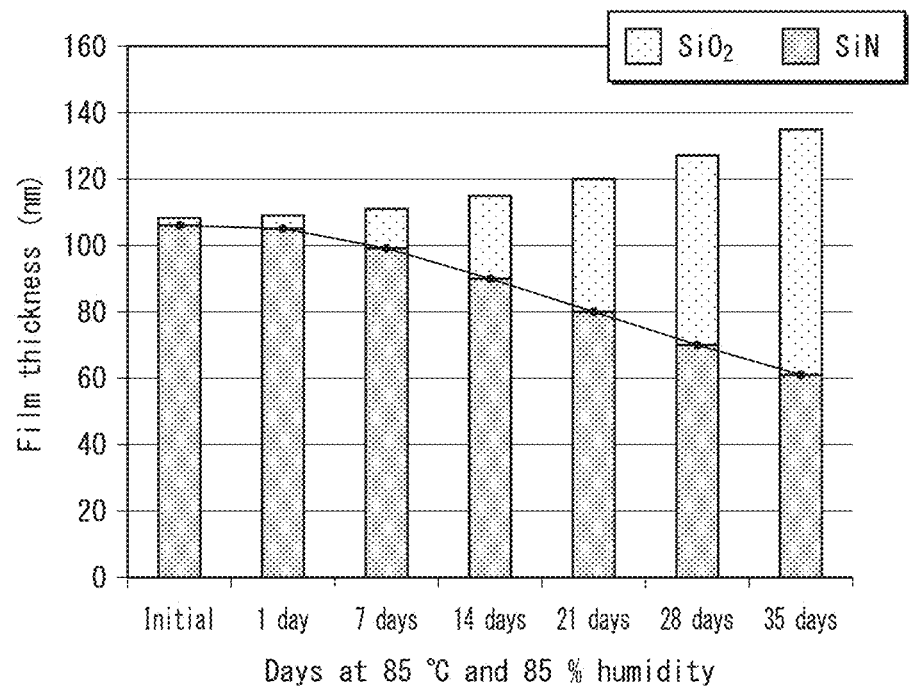
FIG. 3A is a diagram of results of an accelerated moisture absorption examination performed by using a first sealing layer 108a pertaining to at least one embodiment.
Figure 3B:
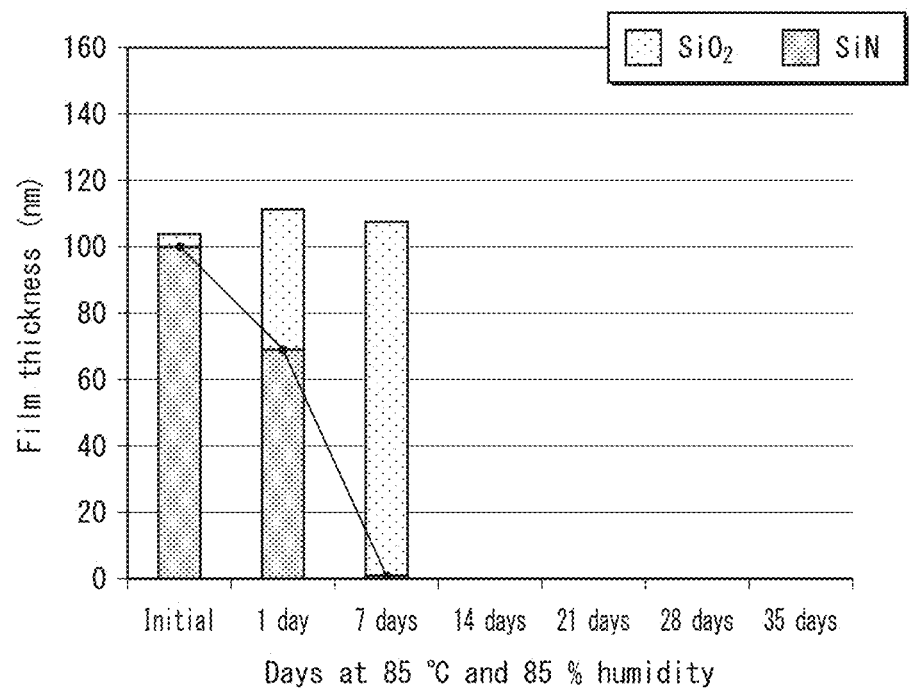
FIG. 3B is a diagram of results of an accelerated moisture absorption examination performed by using a second sealing layer 108b pertaining to at least one embodiment.

FIG. 3A is a diagram of results of an accelerated moisture absorption examination performed by using the first sealing layer 108a and the third sealing layer 108c, and FIG. 3B is a diagram of results of an accelerated moisture absorption examination performed by using the second sealing layer 108b. In the accelerated moisture absorption examinations, one of the main surfaces of the first sealing layer 108a having a film thickness of approximately 100 nm is exposed to an environment of a temperature of 85° C. and humidity of 85%, and an amount of SiN is measured as a film thickness from the other of the main surfaces of the first sealing layer 108a; likewise, one of the main surfaces of the second sealing layer 108b having film a thickness of approximately 100 nm is exposed to an environment of a temperature of 85° C. and humidity of 85%, and an amount of SiN is measured as a film thickness from the other of the main surfaces of the second sealing layer 108b. That is, the greater the film thickness of SiN, the higher the moisture absorbing property of the sealing layer.

FIG. 3A indicates the film thickness of SiN in the first sealing layer 108a. FIG. 3A indicates that approximately 60% of an initial film thickness of SiN is maintained even after 35 days. In contrast, FIG. 3B indicates the film thickness of SiN in the second sealing layer 108b. In FIG. 3B, only about 70% of the initial film thickness of SiN remains after a day and almost all SiN is lost after seven days.

Figure 4A:
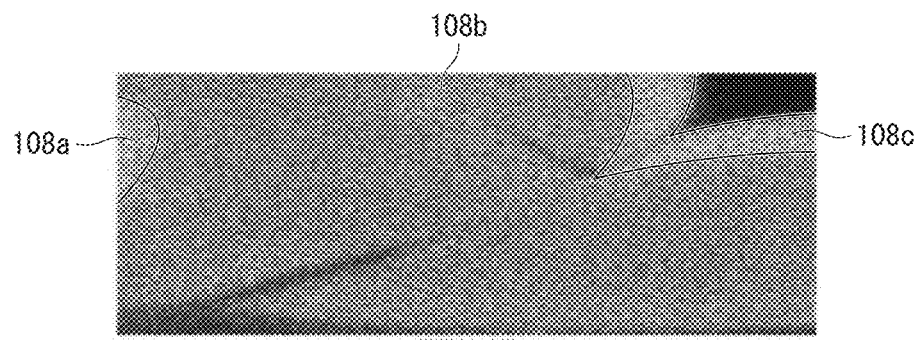
FIG. 4A, FIG. 4B, and FIG. 4C are diagrams of positions where silicon (Si), nitrogen (N), and oxygen (O) are detected, in a cross-section of the sealing layer 108 pertaining to at least one embodiment after performing an accelerated moisture absorption examination, obtained through energy-dispersive X-ray spectroscopy (EDX).
Figure 4B:
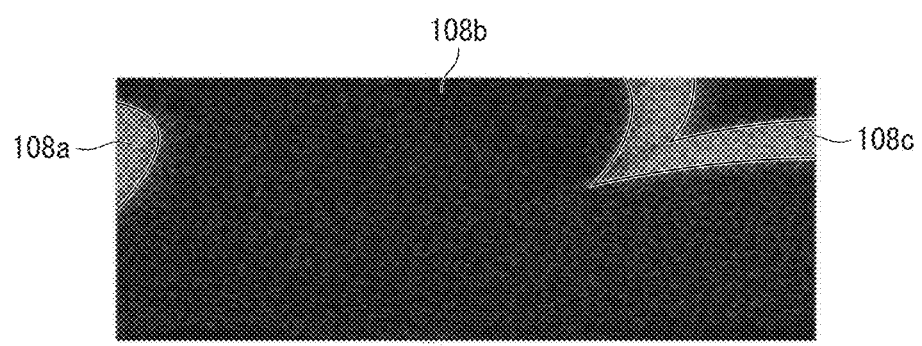
Figure 4C:
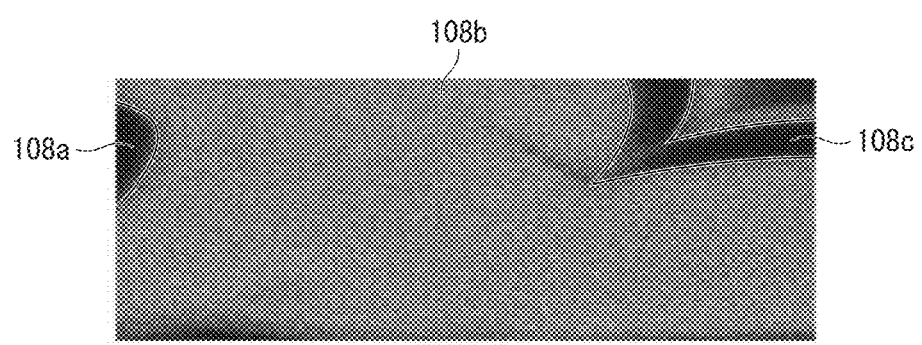

FIG. 4A, FIG. 4B, and FIG. 4C are diagrams of results obtained by performing an accelerated moisture absorption examination by using the sealing layer 108 of at least one embodiment that is cut in a direction orthogonal to a main surface of the sealing layer 108 and then performing energy-dispersive X-ray spectroscopy (EDX). FIG. 4A is a diagram of intensity distribution of Kα rays representing silicon (Si), FIG. 4B is a diagram of intensity distribution of Kα rays representing nitrogen (N), and FIG. 4C is a diagram of intensity distribution of Kα rays representing oxygen (O). In FIG. 4A, silicon (Si) is detected in the entire area of the sealing layer. In FIG. 4B, while nitrogen (N) is detected in the first sealing layer 108a and the third sealing layer 108c, almost no nitrogen (N) is detected in the second sealing layer 108b. In FIG. 4C, while almost no oxygen (O) is detected in the first sealing layer 108a and the third sealing layer 108c, a significant amount of oxygen (O) is detected in the second sealing layer 108b. The above results indicate that silicon nitride at the surface of the second sealing layer 108b has changed into silicon oxynitride or silicon oxide due to reaction with moisture. Specifically, Si—N groups at the surface of the second sealing layer 108b are not stable, and therefore N—H bonds are formed between Si—N groups and hydrogen (H) in water molecules and nitrogen leaves the second sealing layer 108b as ammonia. Consequently, oxygen (O) enters sites from which nitrogen has left, and silicon-oxygen (Si—O) groups are formed.

As described above, the second sealing layer 108b has a moisture absorbing property and has a characteristic of changing into silicon oxynitride or silicon oxide through absorbing moisture.

<Sealing Property of Sealing Layer 108>

Figure 2:
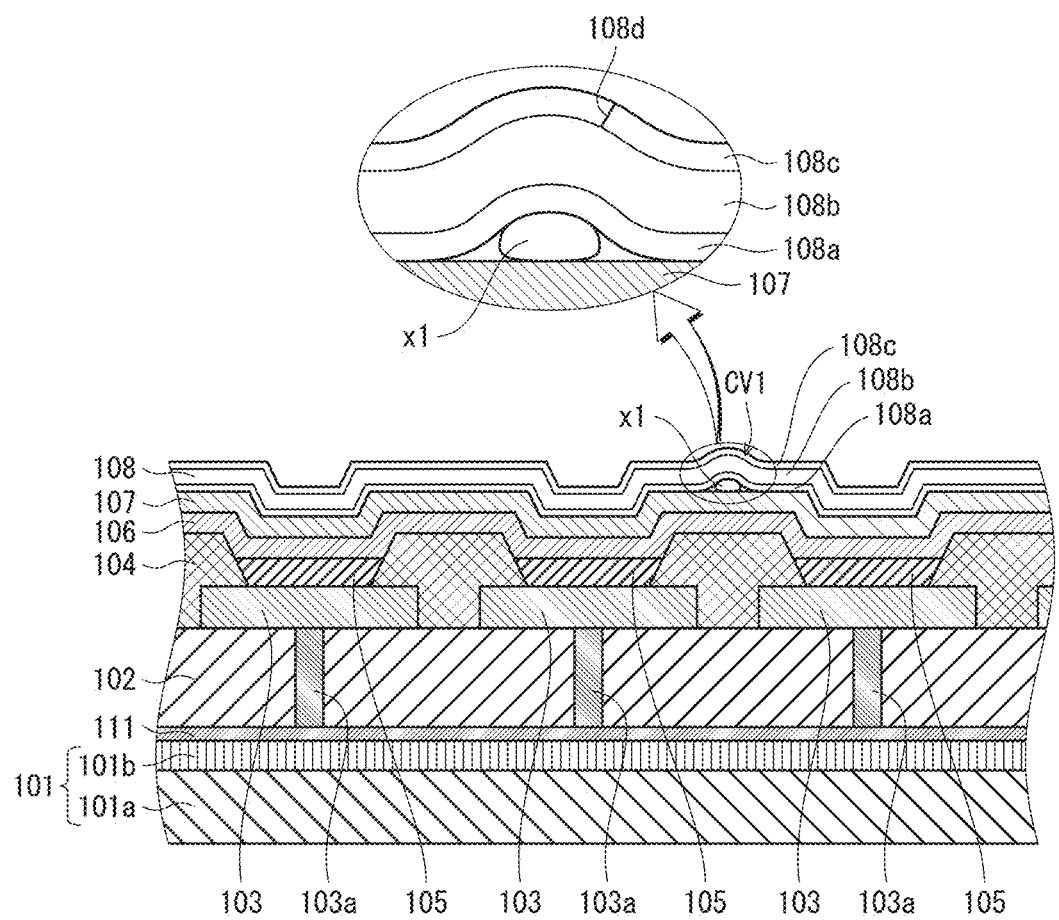
FIG. 2 is a schematic cross-sectional view of a state of a sealing layer 108 on an impurity x1 in the organic EL display panel 1 pertaining to at least one embodiment.

The following describes the sealing property of the sealing layer 108, which has a structure described above. FIG. 2 is a diagram of a cross-sectional structure of the sealing layer 108 in which an impurity exists in a portion that is to be coated. The sealing layer 108 covers an impurity x1 on the counter electrode 107, and therefore a crack 108d may appear in the third sealing layer 108c. However, as described above, the second sealing layer 108b has a moisture absorbing property, and therefore moisture would not reach the first sealing layer 108a. Nitrogen that leaves the second sealing layer 108b when the second sealing layer 108b absorbs moisture, specifically ammonia, may have negative effects on the organic EL elements. However, the first sealing layer 108a would not allow ammonia to penetrate, and therefore ammonia would not progress into the counter electrode 107 and the region below the counter electrode 107.

Further, when there is no crack in the third sealing layer 108c, the second sealing layer 108b does not come into contact with moisture. Accordingly, the second sealing layer 108b remains stable as silicon nitride. Thus, the second sealing layer 108b exhibits the moisture absorbing property only when sealing against moisture is lost in at least one of the first sealing layer 108a and the third sealing layer 108c. Accordingly, moisture repellency of the sealing layer 108 without flaws would not deteriorate naturally.

As described above, the sealing layer 108 has a high sealing property against moisture irrespective of whether or not the sealing layer 108 has a flaw.

3. Organic EL Display Panel Manufacturing Method

Figure 5:
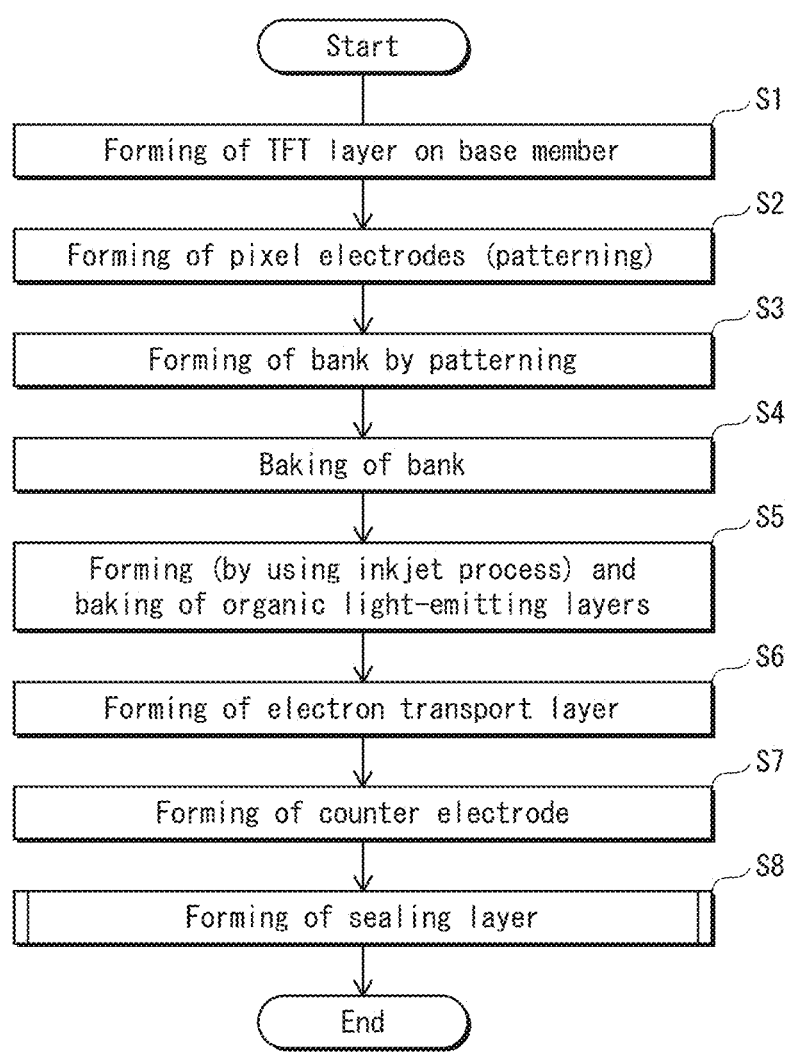
FIG. 5 is a flowchart of processes of manufacturing the organic EL display panel 1 pertaining to at least one embodiment.

The following describes a method of manufacturing the organic EL display panel 1, with reference to the drawings. FIG. 5 is a flowchart of processes of manufacturing the organic EL display panel 1.

(1) Forming Substrate 101

First, the substrate 101 is formed through forming the TFT layer 101b on the base member 101a (step S1) through a known TFT manufacturing method.

Then, the interlayer insulating layer 102 is formed on the substrate 101 through laminating with use of, for example, PECVD, sputtering, or the like.

Then, portions of the interlayer insulating layer 102 on source electrodes of the TFT layer 101b are dry-etched to form the contact holes. The contact holes are formed such that surfaces of the source electrodes are exposed at the bottom of the contact holes.

Next, connection electrode layers are formed along inner walls of the contact holes. Upper portions of the connection electrode layers are partially over the interlayer insulating layer 102. The connection electrode layers are formed through, for example, sputtering. Specifically, the connection electrode layers are formed through forming a metal film and patterning the metal film through photolithography and wet-etching.

(2) Forming Pixel Electrodes 103

Next, a pixel electrode material layer is formed on the interlayer insulating layer 102 through, for example, vacuum vapor deposition or sputtering.

Next, the pixel electrode material layer is patterned through etching to form a plurality of pixel electrodes 103 that are separated to correspond one-to-one with the subpixels (step S2).

(3) Forming Bank Layer 104

Next, a bank material layer is formed through applying, on the pixel electrodes 103 and the interlayer insulating layer 102, a bank layer resin that is a material of the bank layer 104. The bank material layer is formed through obtaining a solution through dissolving a phenolic resin that is the bank layer resin into a solvent (such as a mixed solvent of ethyl lactate and γ-Butyrolactone (GBL)) and uniformly applying the solution on the pixel electrodes 103 and the interlayer insulating layer 102 through spin coating or the like. Then, the bank layer 104 is formed through applying pattern exposure and developing to the bank material layer (step S3), and the bank layer 104 is baked (step S4). Due to this, the openings, which are regions in which the light-emitting layers 105 are formed, are defined. Baking of the bank layer 104 is performed, for example, for sixty minutes at a temperature from 150° C. to 210° C.

Further, in the process of forming the bank layer 104, a surface of the bank layer 104 may be treated by using a defined liquid such as an alkaline solution, water, an organic solvent, or the like, or through applying a plasma treatment. This is performed for the purpose of adjusting the angle of contact between the bank layer 104 and ink (solution) to be ejected into the openings or for the purpose of providing the surface of the bank layer 104 with liquid repellency.

(4) Forming Light-Emitting Layers 105

Next, ink including a component material of the light-emitting layers 105 is applied to the openings, which are defined by the bank layer 104, by using an inkjet device and drying (baking) is performed to form the light-emitting layers 105 (step S5).

(5) Forming Electron Transport Layer 106

Next, the electron transport layer 106 is formed on the light-emitting layer 105 and the bank layer 104 (step S6) through, for example, vapor deposition such that the electron transport layer 106 spans over the subpixels.

(6) Forming Counter Electrode 107

Next, the counter electrode 107 is formed on the electron transport layer 106 (step S7) through, for example, forming a film of ITO, IZO, silver, aluminum, or the like through sputtering or vacuum vapor deposition.

(7) Forming Sealing Layer 108

Finally, the sealing layer 108 is formed on the counter electrode 107 (step S8) through forming a film of SiN through PECVD. Details of forming of the sealing layer 108 are described later.

Note that a color filter or an upper substrate may further be placed on the sealing layer 108 and joined to the sealing layer 108.

4. Sealing Layer 108 Manufacturing Method

The following describes a method of manufacturing the sealing layer 108 in detail.

<Structure of Film-Forming Device>

Figures 6A, 6B:
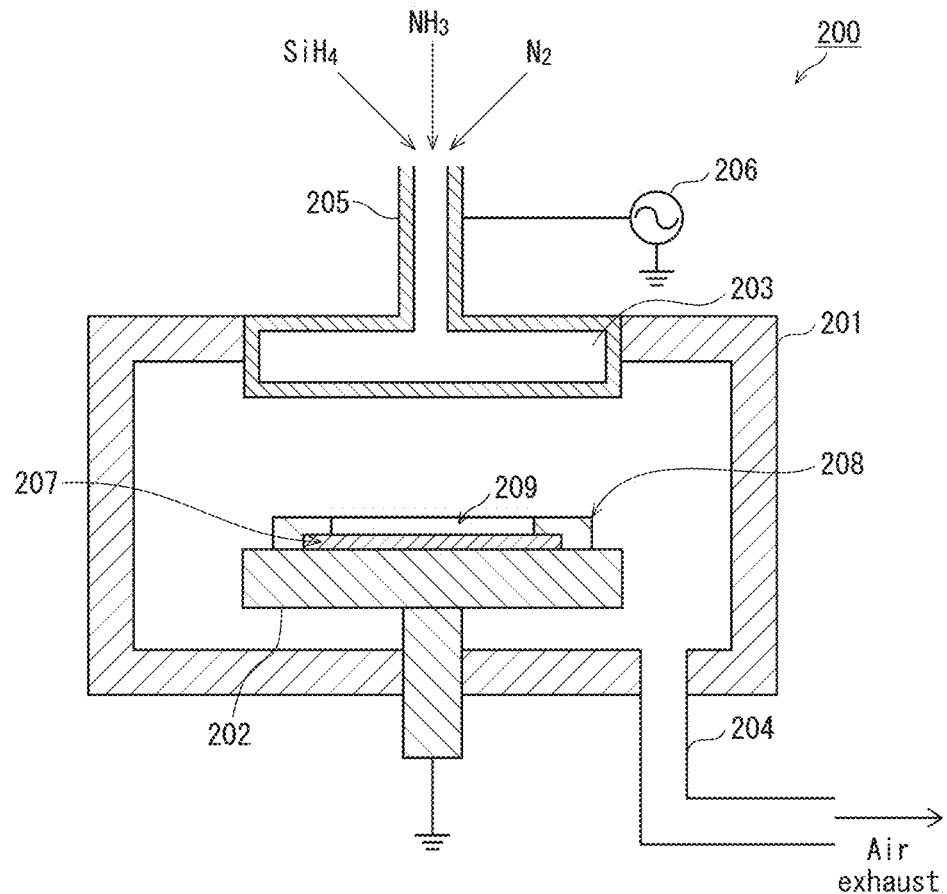
FIG. 6A is a schematic cross-sectional view of a device for forming the sealing layer 108 pertaining to at least one embodiment.
FIG. 6B is a table of an example of film-forming conditions for the sealing layer 108 pertaining to at least one embodiment.

FIG. 6A is a schematic diagram of a structure of a PECVD film-forming device 200. In FIG. 6A, the PECVD film-forming device 200 includes a reaction chamber 201, a substrate holder 202, a shower head 203, an air outlet 204, a gas inlet 205, and a high-frequency power supply 206.

The reaction chamber 201 is a box body that has a reaction space for plasma reaction inside the reaction chamber 201.

The substrate holder 202 is a holder for placing a substrate of the organic EL display panel 1 before forming of the sealing layer 108 (unsealed organic EL substrate 207) and includes a heater for heating the unsealed organic EL substrate 207. Further, the substrate holder 202 is grounded because the substrate holder 202 functions also as a ground electrode that is one of the electrodes for plasma discharge.

The shower head 203 faces the substrate holder 202 and sprays, through slits, reaction gas introduced from the gas inlet 205. Further, the shower head 203 and the gas inlet 205 function as the other of the electrodes for the plasma discharge. Accordingly, the shower head 203 and the gas inlet 205 are connected to the high-frequency power supply 206 and are insulated from the reaction chamber 201.

The air outlet 204 exhausts air from the reaction chamber 201. Due to this air exhaust, the reaction chamber 201 maintains a desired pressure.

The gas inlet 205 is an inlet for introducing reaction gas and cleaning gas into the reaction chamber 201.

The high-frequency power supply 206 is an alternating power supply that generates microwaves for the plasma discharge.

The unsealed organic EL substrate 207 is a substrate before the sealing layer 108 in FIG. 1 is formed and after a display region 41 is formed at a central portion of the unsealed organic EL substrate 207. That is, the unsealed organic EL substrate 207 is an organic EL display panel after completion of step S7 in FIG. 5. The unsealed organic EL substrate 207 is attached to a mask 208 and placed on the substrate holder 202.

The mask 208 is a mask member that defines a region in which the sealing layer 108 is formed. The mask 208 has a shape of a rectangular frame whose outer peripheries are larger than the unsealed organic EL substrate 207 and has an opening 209. The mask 208 is made of, for example, ceramic.

<Film-Forming Conditions>

FIG. 6B is a table of an example of the film-forming conditions for the first sealing layer 108a and the third sealing layer 108c and an example of the film-forming conditions for the second sealing layer 108b. As described above, different film-forming conditions are used when forming the first sealing layer 108a and the third sealing layer 108c and when forming the second sealing layer 108b.

In FIG. 6B, the film-forming conditions for the first sealing layer 108a and the third sealing layer 108c are defined as a flow rate of silane gas sprayed from the shower head 203 of 100 standard cubic centimeters per minute (sccm), a flow rate of ammonia gas of 70 sccm, and a flow rate of nitrogen gas of 3000 sccm. That is, a ratio of silane to ammonia (hereinafter referred to as "silane/ammonia ratio") in the material gas is approximately 1.4. A pressure in the reaction chamber 201 is 100 Pa.

In contrast, when forming the second sealing layer 108b, the pressure in the reaction chamber 201 is from 200 Pa to 500 Pa. Further, the flow rate of the silane gas and the flow rate of the ammonia gas are adjusted such that the silane/ammonia ratio in the material gas becomes from 0.2 to 0.65. Due to this, a ratio of the number of N atoms to the number of Si atoms is greater in the second sealing layer 108b than in the first sealing layer 108a and the third sealing layer 108c.

<Processes of Forming Sealing Layer 108>

Figure 7:
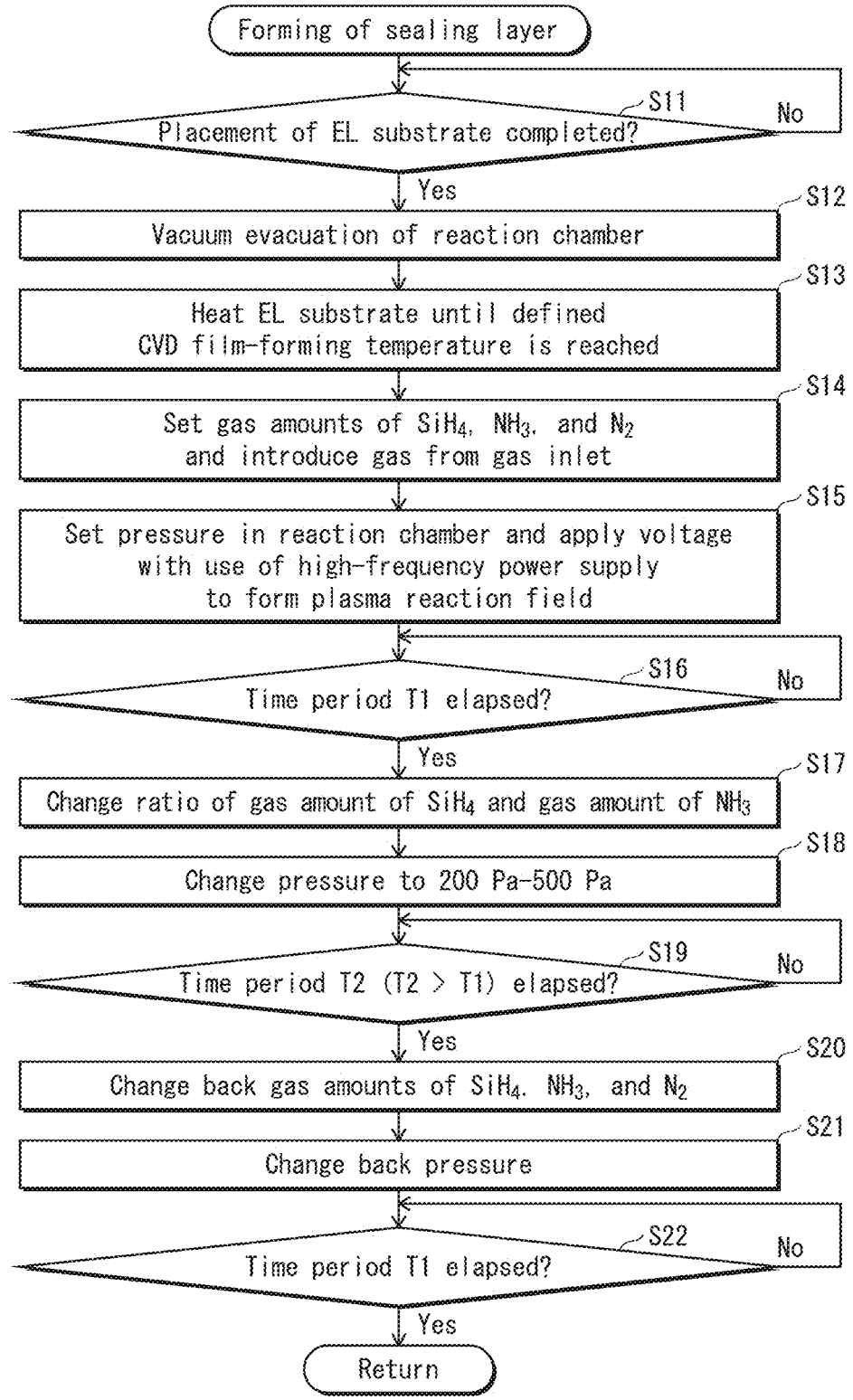
FIG. 7 is a flowchart of processes of forming the sealing layer 108 pertaining to at least one embodiment.

The following describes processes of forming the sealing layer 108 in detail, with reference to the flowchart in FIG. 7.

First, the unsealed organic EL substrate 207 is placed on the substrate holder 202 (step S11), and vacuum evacuation of the reaction chamber 201 is performed (step S12). Next, the unsealed organic EL substrate 207 is heated until a temperature of the unsealed organic EL substrate 207 reaches a defined film-forming temperature (step S13). Here, the defined film-forming temperature is, for example, 60° C.

Then, an amount of the silane gas, an amount of the ammonia gas, and an amount of the nitrogen gas are set to defined gas amounts, and the material gas is supplied from the gas inlet 205 into the reaction chamber 201 (step S14). Here, the defined gas amounts are defined as a flow rate of the silane gas of 100 sccm, a flow rate of the ammonia gas of 70 sccm, and a flow rate of the nitrogen gas of 3000 sccm.

With the state described above maintained, the pressure in the reaction chamber 201 is set to 100 Pa, and a plasma reaction field is formed in proximity of a surface of the unsealed organic EL substrate 207 through applying a voltage with use of the high-frequency power supply 206 (step S15). Due to this, forming of the first sealing layer 108a is started. Through forming a plasma reaction field only for a defined time period T1 (step S16), the first sealing layer 108a having a thickness in correspondence with the defined time period T1 is formed.

Next, the film-forming conditions are changed into the film-forming conditions for the second sealing layer 108b. Specifically, first, the silane/ammonia ratio in the material gas introduced into the reaction chamber 201 is changed (step S17). Here, the flow rate of the silane gas and the flow rate of the ammonia gas are changed such that the silane/ammonia ratio in the material gas becomes from 0.2 to 0.65. Further, the pressure in the reaction chamber 201 is changed to be within a range from 200 Pa to 500 Pa (step S18). Due to this, forming of the second sealing layer 108b is started. Through forming a plasma reaction field only for a defined time period T2 (step S19), the second sealing layer 108b having a thickness in correspondence with the defined time period T2 is formed.

Next, the film-forming conditions are changed into the film-forming conditions for the third sealing layer 108c. Specifically, first, the gas amounts in the material gas introduced into the reaction chamber 201 are changed back into the conditions that are used when forming the first sealing layer 108a (conditions used in step S14) (step S20). Further, the pressure in the reaction chamber 201 is changed into the pressure that is used when forming the first sealing layer 108a (100 Pa) (step S21). Due to this, forming of the third sealing layer 108c is started. Through forming a plasma reaction field only for the defined time period T1 (step S22), the third sealing layer 108c having a thickness in correspondence with the defined time period T1 is formed.

<Composition and Optical Characteristics of Sealing Layer>

Figure 8:
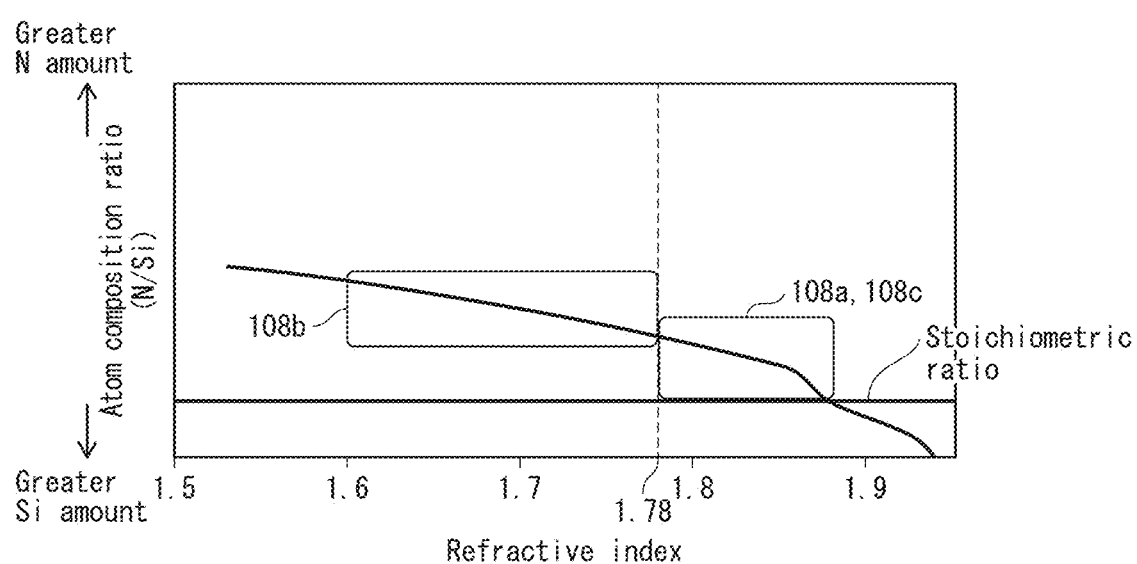
FIG. 8 is a diagram of a relationship between composition and a refractive index of silicon nitride.

FIG. 8 is a diagram of a relationship between composition of amorphous silicon nitride formed through PECVD (i.e. a ratio of the number of N atoms to the number of Si atoms; hereinafter referred to as the N/Si ratio) and a refractive index of amorphous silicon nitride formed through PECVD. In FIG. 8, the greater the N/Si ratio is, the smaller the refractive index tends to be. The N/Si ratio in the first sealing layer 108a and the third sealing layer 108c is approximately the stoichiometric ratio of crystalline silicon nitride or greater, and the refractive index in the first sealing layer 108a and the third sealing layer 108c is in a range from 1.78 to 1.9. In contrast, the N/Si ratio in the second sealing layer 108b, which has a moisture absorbing property, is greater than the N/Si ratio in the first sealing layer 108a and the third sealing layer 108c, and the refractive index in the second sealing layer 108b is in a range from 1.6 to 1.78. This is because the film structure of the Si—N bonds in the second sealing layer 108b is not as uniform as in the first sealing layer 108a and the third sealing layer 108c and therefore the second sealing layer 108b has a low density. Accordingly, the second sealing layer 108b has a smaller refractive index than the first sealing layer 108a and the third sealing layer 108c.

<Synopsis>

As described above, the organic EL display panel 1 pertaining to the present embodiment seals the organic EL elements by the sealing layer 108, which has a high sealing property against moisture. Accordingly, even when the organic EL display panel 1 is placed in a severe environment with a high temperature and high humidity, the sealing property of the sealing layer 108 is helped to be maintained. Thus, the organic EL display panel pertaining to the present embodiment helps to maintain durability in a severe environment.

Further, according to the above-described manufacturing method, the unsealed organic EL substrate 207 is placed on the substrate holder 202 in the reaction chamber 201 from the start of forming of the first sealing layer 108a until forming of the third sealing layer 108c is completed. This thus helps to suppress entrance of impurities into the sealing layer 108, and therefore has lower possibility of generation of a flaw that spans over two or more of the three layers of the sealing layer 108.

<Other Modifications>

(1) In the present embodiment, the sealing layer 108 covers the display region 41 in which the organic EL elements are arranged and a peripheral region 42, but the sealing layer 108 may cover only the display region 41. Alternatively, the sealing layer 108 may cover only the peripheral region 42. Further, the sealing layer 108 need not cover the entire areas of the display region 41 and the peripheral region 42; the sealing layer 108 may cover only a portion of the display region 41 and/or the peripheral region 42.

(2) In the present embodiment, in the film-forming conditions for the second sealing layer 108b, both the pressure and the ratio of the flow rate of ammonia to the flow rate of silane are greater than in the film-forming conditions for the first sealing layer 108a and the third sealing layer 108c. However, as long as the second sealing layer 108b having properties described above is formed, a configuration in which only one of the pressure and the ratio of the flow rate of ammonia to the flow rate of silane is greater in the film-forming conditions for the second sealing layer 108b than in the film-forming conditions for the first sealing layer 108a and the third sealing layer 108c is possible.

Further, in the present embodiment, the film-forming conditions and the composition of the first sealing layer 108a and the film-forming conditions and the composition of the third sealing layer 108c are the same. However, the film-forming conditions and the composition of the first sealing layer 108a and the film-forming conditions and the composition of the third sealing layer 108c may differ from each other as long as they are within ranges in which both the first sealing layer 108a and the third sealing layer 108c have high sealing properties.

(3) In the present embodiment, a counter-electrode-side of the organic EL elements is sealed only by the sealing layer 108. However, for example, a structure in which the counter-electrode-side of the organic EL elements is sealed by a sealing film that is a laminate of the sealing layer 108 and another sealing layer such as a sealing layer made of an organic material is possible. Further, a structure in which a color filter substrate or the like is joined to an upper surface of the sealing layer 108 is possible.

Further, when the base member 101a is a so-called flexible substrate made of a resin, the organic EL display panel may include, between the base member 101a and the TFT layer 101b, the sealing layer 108 or a sealing film including the sealing layer 108. This structure helps to suppress penetration of moisture from a substrate-side of the organic EL display panel.

(4) In the present embodiment, the organic EL elements each include a pixel electrode, a light-emitting element, an electron transport layer, and a counter electrode. However, the organic EL elements may each include, between the pixel electrode and the light-emitting layer, a hole injection layer and/or a hole transport layer. Further, the organic EL elements may include, between the electron transport layer and the counter electrode, an electron injection layer. Further, the present embodiment has a top-emission type structure in which the pixel electrodes are reflective electrodes and the counter electrode is a light-transmissive electrode. However, a bottom-emission type structure in which the pixel electrodes are light-transmissive electrodes and the counter electrode is a reflective electrode is possible.

Although an organic light-emitting panel and a display device pertaining to the present disclosure have been fully described based on embodiments and modifications, the present disclosure should not be construed as being limited to the above embodiments and modifications. It is to be noted that one or more embodiments that are obtained through applying various changes and modifications that are conceived by a skilled artisan and one or more embodiments that are achieved through combining elements and functions of embodiments and modifications that do not depart from the spirit of the present invention are also included in the present invention.

The organic EL display panel manufacturing method pertaining to the present disclosure is useful for manufacturing an organic EL display panel and/or a display device that has great durability and can be placed in any location.

Although one or more embodiments pertaining to the present disclosure have been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:

1. An organic electroluminescence (EL) display panel, comprising:
   a substrate;
   a plurality of organic EL elements;
   an electrode; and
   a sealing layer in this order, wherein the sealing layer has a three-layered structure in the order of a first sealing layer, a second sealing layer, and a third sealing layer, and the first sealing layer directly contacts the electrode,
   the first sealing layer, the second sealing layer, and the third sealing layer each include amorphous silicon nitride, and
   wherein composition of the first sealing layer, composition of the second sealing layer, and composition of the third sealing layer are each indicated as $SiN_x$, and wherein a value of x in the composition of the second sealing layer is greater than both a value of x in the composition of the first sealing layer and a value of x in the composition of the third sealing layer.

2. The organic EL display panel of claim 1, wherein the second sealing layer has a smaller refractive index than the first sealing layer and the third sealing layer.

3. The organic EL display panel of claim 2, wherein the refractive index of the second sealing layer is from 1.60 to 1.78.

4. The organic EL display panel of claim 1, wherein the first sealing layer and the third sealing layer have substantially the same refractive indices.

5. The organic EL display panel of claim 1, wherein the first sealing layer, the second sealing layer, and the third sealing layer are in an atmosphere of the same temperature and the same humidity, a material of the second sealing layer has greater reactivity in a reaction of absorbing oxygen from moisture in the atmosphere than both a material of the first sealing layer and a material of the third sealing layer.

6. The organic EL display panel of claim 5, wherein the third sealing layer has a flaw, a portion of the second sealing layer corresponding to the flaw of the third sealing layer is exposed to air, and a ratio of a number of oxygen atoms to a number of silicon atoms is greater in the second sealing layer than in the first sealing layer and in the third sealing layer.

7. The organic EL display panel of claim 1, wherein x is greater than 1 for each of the first sealing layer, the second sealing layer and the third sealing layer.

8. The organic EL display panel of claim 1, wherein the second sealing layer is thicker than the third sealing layer.

9. The organic EL display panel of claim 1, wherein a refractive index of each of the first sealing layer and the third sealing layer is less than 1.9.

10. The organic EL display panel of claim 1, wherein a refractive index of the first sealing layer ranges from 1.8 to 1.9.

11. The organic EL display panel of claim 1, wherein the second sealing layer contains more oxygen than each of the first sealing layer and the third sealing layer.

12. The organic EL display panel of claim 1, wherein the sealing layer consists of the first sealing layer, the second sealing layer and the third sealing layer.

13. An organic electroluminescence (EL) display panel, comprising:
    a substrate;
    a plurality of organic EL elements;
    an impurity;
    an electrode; and
    a sealing layer in this order, wherein the sealing layer has a three-layered structure in the order of a first sealing layer, a second sealing layer, and a third sealing layer, the first sealing layer directly contacts the electrode, and a flaw exists in a portion of the third sealing layer directly above the impurity,
    the first sealing layer, the second sealing layer, and the third sealing layer each include amorphous silicon nitride, the first sealing layer having a composition SiNx, the second sealing layer having a composition SiNy, and y is greater than x, and
    wherein the first sealing layer, the second sealing layer, and the third sealing layer are in an atmosphere of the same temperature and the same humidity, a material of the second sealing layer has greater reactivity in a reaction of absorbing oxygen from moisture in the atmosphere than both a material of the first sealing layer and a material of the third sealing layer.

14. The organic EL display panel of claim 13, wherein a portion of the second sealing layer corresponding to the flaw of the third sealing layer is exposed to air, and a ratio of a number of oxygen atoms to a number of silicon atoms is greater in the second sealing layer than in the first sealing layer and in the third sealing layer.

15. The organic EL display panel of claim 13, wherein the second sealing layer is thicker than the third sealing layer.

16. The organic EL display panel of claim 13, wherein a refractive index of each of the first sealing layer and the third sealing layer is less than 1.9.

17. The organic EL display panel of claim 13, wherein a refractive index of the second sealing layer ranges from 1.6 to 1.78.

18. The organic EL display panel of claim 13, wherein each of the first sealing layer, the second sealing layer and the third sealing layer has a nitrogen concentration greater than a stoichiometric ratio of silicon nitride.

19. An organic electroluminescence (EL) display device comprising:
    an organic EL display panel, comprising:
        a substrate;
        a plurality of organic EL elements;
        an electrode; and
        a sealing layer in this order, wherein the sealing layer has a three-layered structure in the order of a first sealing layer, a second sealing layer, and a third sealing layer, and the first sealing layer directly contacts the electrode,
        the first sealing layer, the second sealing layer, and the third sealing layer each include amorphous silicon nitride, and
        wherein composition of the first sealing layer, composition of the second sealing layer, and composition of the third sealing layer are each indicated as $SiN_x$, and
        wherein a value of x in the composition of the second sealing layer is greater than both a value of x in the composition of the first sealing layer and a value of x in the composition of the third sealing layer.

20. An organic electroluminescence (EL) display device comprising:
    an organic EL display panel comprising:
        a substrate;
        a plurality of organic EL elements;
        an electrode;
        an impurity, wherein a dimension of the impurity parallel to a top surface of the substrate is less than a dimension of an organic EL element of the plurality of organic EL elements parallel to the top surface of the substrate; and
        a sealing layer in this order, wherein the sealing layer has a three-layered structure in the order of a first sealing layer, a second sealing layer, and a third sealing layer, a portion of the second sealing layer is exposed to air, the first sealing layer directly contacts the electrode, and the portion of the second sealing layer is directly above the impurity,
        the first sealing layer, the second sealing layer, and the third sealing layer each include amorphous silicon nitride, the third sealing layer having a composition SiNx, the second sealing layer having a composition SiNy, and y is greater than x, and
        wherein the first sealing layer, the second sealing layer, and the third sealing layer are in an atmosphere of the same temperature and the same humidity, a material of the second sealing layer has greater reactivity in a reaction of absorbing oxygen from moisture in the atmosphere than both a material of the first sealing layer and a material of the third sealing layer.

\* \* \* \* \*